United States Patent [19]

Seifert et al.

[11] Patent Number: 4,824,496

[45] Date of Patent: Apr. 25, 1989

[54] METHOD AND APPARATUS FOR REMOVING RETICLE GUIDES

[75] Inventors: Willis Seifert, Cupertino; Michael Loeffler, Sunnyvale, both of Calif.

[73] Assignee: Intel Corporation, Santa Clara, Calif.

[21] Appl. No.: 137,884

[22] Filed: Dec. 24, 1987

[51] Int. Cl.⁴ .............................................. B31B 1/00
[52] U.S. Cl. ..................................... 156/64; 156/344; 156/359; 156/584
[58] Field of Search .................. 156/344, 584, 359, 64

[56] References Cited
U.S. PATENT DOCUMENTS 2,363,442 11/1944 Scott ............................... 156/344 X
2,711,984 6/1955 Kingman .............................. 156/344

FOREIGN PATENT DOCUMENTS 56-12735 7/1981 Japan ................................... 156/344

*Primary Examiner*—David Simmons
*Attorney, Agent, or Firm*—Blakely, Sokoloff, Taylor & Zafman

[57] ABSTRACT

A method and apparatus for removing stepper guides that are adhesively bonded to a reticle. A reticle is supported in a generally horizontal position with the stepper guides in contact with heater blocks. Heating elements are placed within the heater blocks and are supplied with a controlled electrical current to maintain the heater blocks at a predetermined temperature. Heat is transferred from the heater blocks to the stepper guides. After a sufficient amount of time, the adhesive begins to flow and the stepper guides may be removed from the reticle. Separate heater blocks are configured to accommodate standard field and wide field guides.

7 Claims, 2 Drawing Sheets

METHOD AND APPARATUS FOR REMOVING RETICLE GUIDES

FIELD OF THE INVENTION

This invention relates to semiconductor fabrication equipment and particularly to a method and apparatus for removing adhesively bonded stepper guides from glass reticles.

BACKGROUND

One method for processing semiconductor wafers to produce integrated circuits involves the use of step and repeat 1:1 photolithography. A "stepper" is used to sequentially expose each of the individual cells of a wafer through a photographic image to create a photoresist pattern on the surface of the wafer. As the name implies, a stepper steps the image in both the x and y axes to align with each cell on the wafer. The photographic images are typically etched in a chromium layer deposited on a quartz or low expansion glass plate, commonly called a "reticle". The reticle is located in the stepper by means of guides attached to the reticle with an adhesive. By accurately locating the guides on the reticle with respect to the image to be transferred, registration of successive images etched on separate reticles is obtained within the capture distance of an optical position correcting system.

Stepper equipment in common use in the semiconductor fabrication industry, such as that manufactured by Ultratech Stepper Corporation of Santa Clara, Calif., employ lens systems providing either a "standard" or a "wide" field of view. Different reticle configurations are used with the different lens systems.

As mentioned above, guides are typically attached to a reticle with an adhesive, such as a cyanoacrylate adhesive. Guides for a "standard field" reticle are generally attached to the metallized side of the reticle, whereas guides for a "wide field" reticle are generally attached to the non-metallized side. In either case, the guides are securely bonded to the reticle. Should it become necessary to remove a guide from a reticle, mechanical removal by prying off the guide is frequently unsuccessful since the reticle is easily damaged.

A more common technique for guide removal is to place the reticle in an acetone bath. Due to the high quality of the bond achieved between the guide and the reticle, it sometimes requires up to two weeks to remove standard field guides and as long as six months to remove wide field guides. Such a lengthy process cannot be tolerated if a production line is stopped awaiting rework of a reticle. Furthermore, this guide removal technique suffers the inherent disadvantage of using a hazardous solvent.

It is known that heat may be used to melt the adhesive with which guides are bonded to a reticle. Heretofore, guide removal by heat has relied on the use of a soldering iron, wire-stripper or similar tool. Heat applied in this manner is not evenly distributed over the guide-to-reticle bonding surface and may result in localized heating sufficient to damage the reticle.

As will be subsequently described, the present invention provides a means by which guides may be removed from a reticle very quickly, without the use of hazardous chemicals, and with minimal risk of damage to the reticle.

SUMMARY OF THE INVENTION

The present invention provides a method and apparatus for removing stepper guides that are adhesively bonded to a reticle.

The apparatus includes a base above which a reticle is supported in a generally horizontal position. The reticle is partially supported by a heater block and the reticle is placed in the apparatus such that a stepper guide is in contact with the heater block. The temperature of the heater block is controlled to remain at a predetermined value such that the stepper guide in contact therewith is heated to a temperature at which the bonding adhesive flows, thereby allowing the stepper guide to be removed from the reticle.

In a preferred embodiment of the present invention, a pair of heater blocks is employed so that both stepper guides of a reticle may be heated and removed simultaneously. The upper surface of the heater blocks may be shaped to receive one or the other of standard field or wide field stepper guides.

The stepper guides are removed from a reticle by placing the reticle in the apparatus in a generally horizontal position with the stepper guides in contact with the heater blocks. The reticle is left in position for approximately 10 seconds, after which time slight manual pressure is applied in a twisting motion until the stepper guides separate from the reticle.

BRIEF DESCRIPTIONS OF THE DRAWINGS

DETAILED DESCRIPTION OF THE PREFERRED EMBODIMENT

A method and apparatus for removing stepper guides that are adhesively bonded to a reticle are disclosed. In the following description, for purposes of explanation and not limitation, specific numbers, dimensions, materials, etc. are set forth in order to provide a thorough understanding of the present invention. However, it will be apparent to one skilled in the art that the present invention may be practiced without these specific details.

Figure 1:
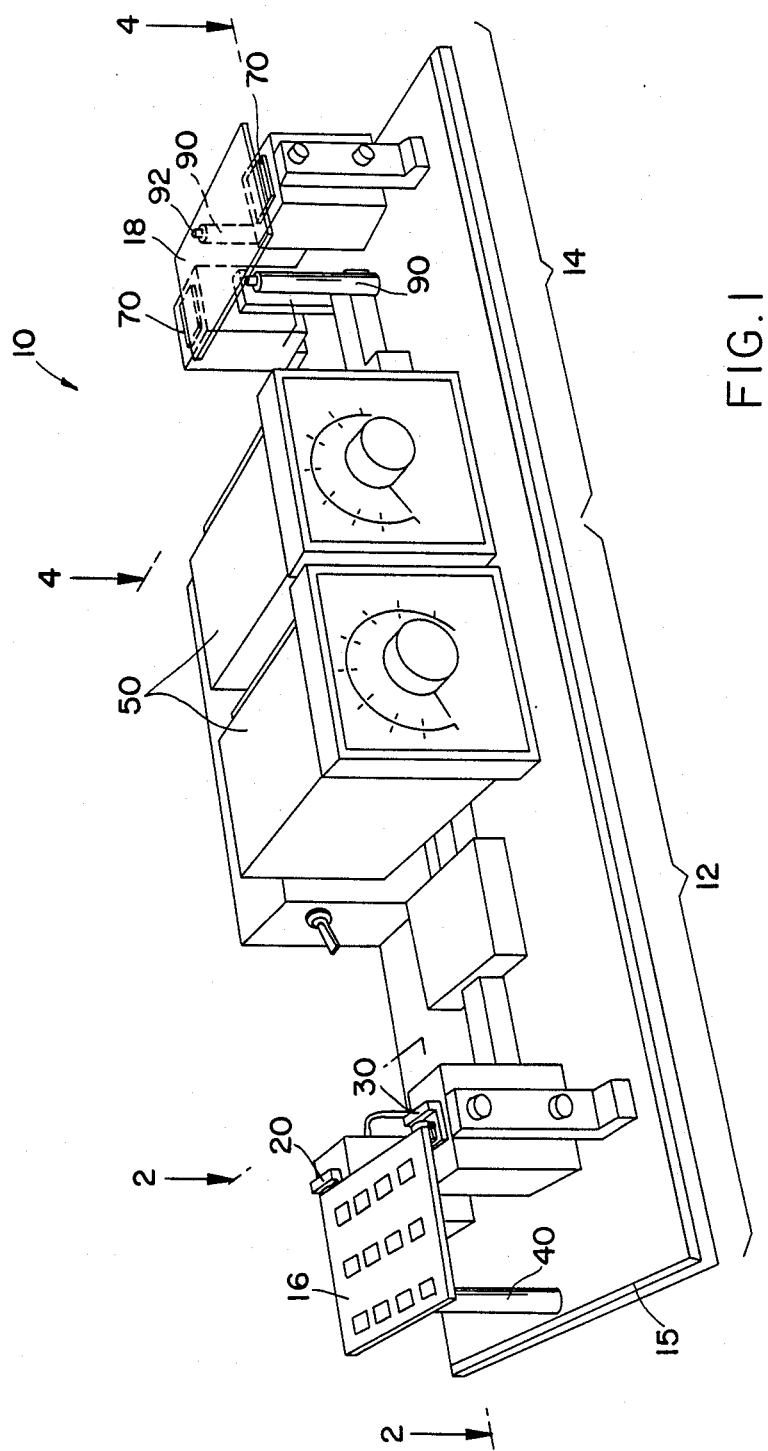
FIG. 1 is a perspective view of an apparatus according to the present invention.

FIG. 1 illustrates an apparatus 10 constructed according to the present invention for removing both standard and wide field stepper guides from their respective reticles. As illustrated, the apparatus consists of two independent sections. Section 12 is for use in removing guides from a wide field reticle such as reticle 16, while section 14 is for use with a standard field reticle such as reticle 18. Both of sections 12 and 14 are conveniently mounted on a common base 15. Obviously, a similar apparatus may be constructed for use with only one or the other type of stepper guide in facilities where only one type of stepper lens system is employed.

Stepper guides 17 and 19 are typically bonded to reticles 16 and 18 respectively with a cyanoacrylate adhesive. Adhesives of this type typically begin to melt at approximately 230° F. The object of the method and apparatus disclosed herein is to bring stepper guides 17 and 19 rapidly to a temperature at which the adhesive will begin to flow such that heat transfer to the reticle, and thus the risk of damage due to thermal stress, is minimized.

Figure 2:
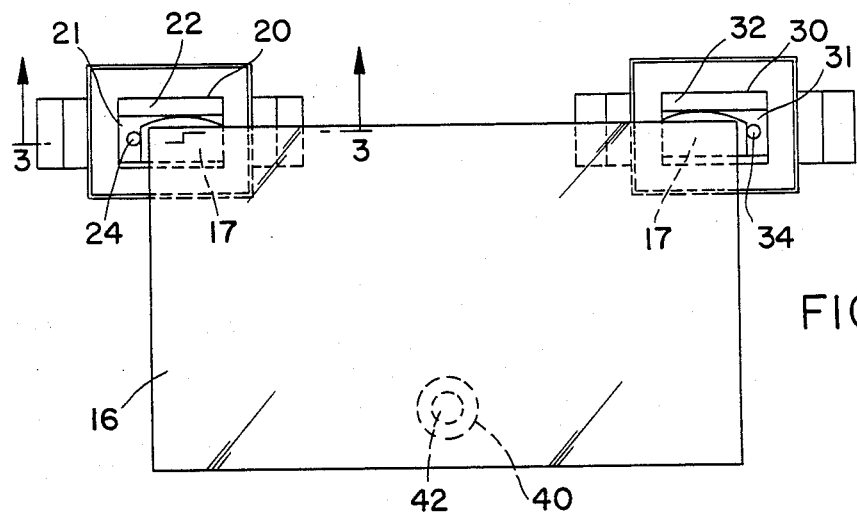
FIG. 2 is a partial overhead plan view of the present invention illustrating removal of wide field guides.

The detailed construction of the device corresponding to section 12 of FIG. 1 for removal of wide field stepper guides will next be described with reference to FIGS. 2 and 3. In FIG. 2, reticle 16 is shown with wide field stepper guides 17 attached thereto. As prescribed by industry standards, wide field stepper guides are located at the corners of reticle 16 and are bonded to the non-metallized surface of the reticle. As shown in FIG. 1, reticle 16 is supported in a generally horizontal position by heater blocks 20 and 30 and support post 40. Reticle 16 is positioned with its metallized surface facing upwardly so that guides 17 rest directly on heater blocks 20 and 30. Stop 22 of heater block 20 and stop 32 of heater block 30 serve to properly position reticle 16 in a fore and aft direction. Pin 24 of heater block 20 and pin 34 of heater block 30 assist in positioning reticle 16 in a sideways direction so that guides 17 are fully in contact with upper surfaces 21, 31 of heater blocks 20 and 30 respectively.

To insure that reticle 16 is supported in a generally horizontal position, support post 40 includes adjustable support rest 42 which may be adjusted vertically. Support rest 42 is preferably made of a non-abrasive material, such as nylon, so that the surface of reticle 16 resting thereon will not be scratched.

Figure 3:
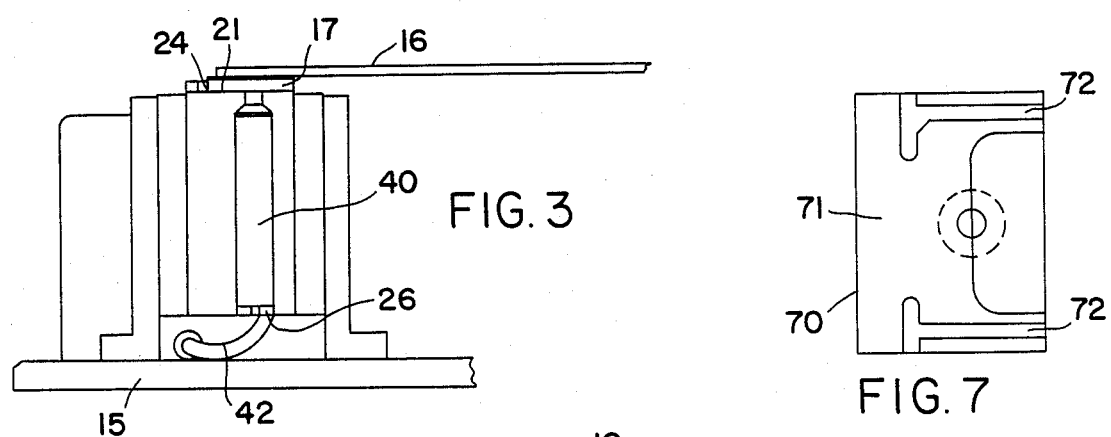
FIG. 3 is a partial sectional view taken along line 3—3 of FIG. 2.

As best seen in FIG. 3, heater block 20 (and likewise heater block 30) is drilled to create cavity 26. The diameter of cavity 26 is such that heater cartridge 40 fits tightly therewithin to insure efficient heat transfer. Heater cartridges 40 are commercially available units comprising a metallic jacketed ceramic body surrounding a resistive heater filament. In the preferred embodiment, heater cartridges 40 are type CIR units manufactured by Chromalox. Electrical current for heater cartridges 40 is supplied by wires 42 from controller unit 50. Controller unit 50 may be any suitable commercial heater controller. In the preferred embodiment, heater controller 50 is a model 550 Type J thermocouple manufactured by Fenwal, Inc. of Ashland, Mass.

The use of section 12 of apparatus 10 to remove wide field stepper guides 17 from reticle 16 will now be described. Reticle 16 is held with its metallized surface facing up and is positioned so that guides 17 are directly above heater blocks 20 and 30. Reticle 16 is then lowered slowly until guides 17 make contact with upper surfaces 21 and 31 and reticle 16 makes contact with support rest 42. As reticle 16 is lowered, care is taken to insure that guides 17 are placed inside of pins 24 and 34 and are against stops 22 and 32.

With the temperature of heater blocks 20 and 30 controlled to remain at 690° F.+/−10° F., reticle 16 is held in position for approximately 10 seconds. Manual pressure is then exerted by an operator to rotate reticle 16 in a horizontal plane. With pressure thus applied, reticle 16 will generally separate from guides 17 after a total heating time of approximately 15–30 seconds.

After guides 17 are separated from reticle 16, any adhesive residue remaining on the non-metallized surface of reticle 16 may be removed with a suitable solvent, such as acetone, or an acid bath. Guides 17 may be removed from heater posts 20 and 30 by suitable means, such as needle nose pliers.

FIGS. 4–7 illustrate the detailed construction of section 14 of FIG. 1 for use in removing standard field stepper guides. Reticle 18 is similar to reticle 16 previously described. However, standard field guides 19 are bonded to the metallized surface of reticle 18 in contrast to the wide field guides 17 which, as previously described, are bonded to the non-metallized surface of reticle 16.

Figure 7:
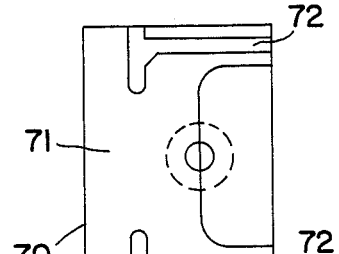
FIG. 7 is a detailed view of a standard field guide heater block.
Figure 4:
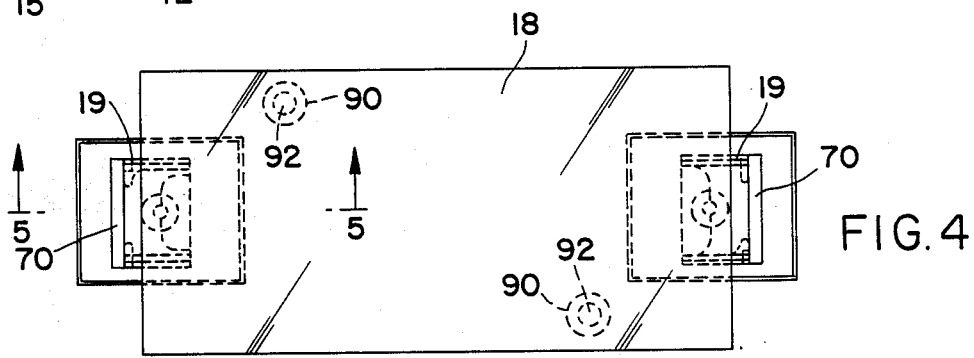
FIG. 4 is a partial overhead plan view of the present invention illustrating removal of standard field guides.
Figure 6:
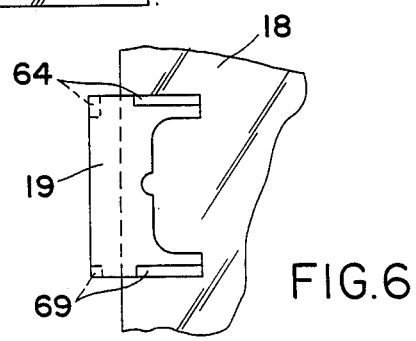
FIG. 6 is a detailed view of a standard field guide.

As illustrated in FIGS. 1 and 4, reticle 18 is placed on apparatus 10 in a generally horizontal position with its non-metallized surface facing upwardly. Standard field guides 19 are thus below the plane of FIG. 4 and rest upon heater blocks 70. As illustrated in FIG. 6, standard field guide 19 includes flanges 64 which are necessary for proper installation of reticle 18 in an appropriate stepper machine. Heater blocks 70 are similar to heater blocks 20 and 30 of section 12 discussed above. However, as best seen in FIG. 7, the upper surfaces 71 of blocks 70 include grooves 72 that receive flanges 64 of standard field guides 19, thereby allowing intimate surface-to-surface contact between guides 19 and heater blocks 70.

Reticle 18 is maintained in an approximately horizontal position by support posts 90. It will be observed that standard field guides 19 are bonded at approximately the midpoint of the shorter edges of reticle 18. Therefore, two support posts 90 are employed to insure that reticle 18 remains horizontal. Support posts 90 include adjustable support rests 92 which may be adjusted vertically. Support rests 92 are similar to support rest 42 and are preferably made of a non-abrasive material, such as nylon. Although the metallized surface of reticle 18 is vulnerable to damage as a result of direct contact with support rests 92, it will be appreciated by those skilled in the art that the operative area of reticle 18 lies in the region between support posts 90. Thus, some abrasion of the metallized surface of reticle 18 by support rests 92, although not desirable, may be tolerated.

Figure 5:
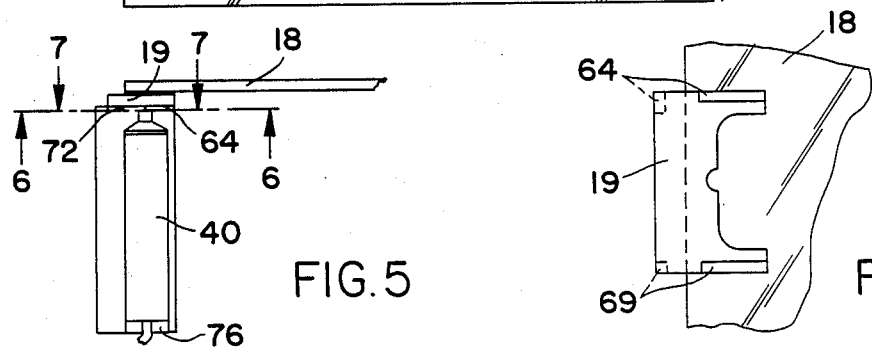
FIG. 5 is a partial sectional view taken along line 5—5 of FIG. 4.

As best seen in FIG. 5, heater block 70 is drilled to create cavity 76 for insertion of heater cartridge 40. Specific details of heater cartridge 40 were identified above. A separate heater controller 50, identical to that described above, is employed to provide heater current to cartridges 40 within heater blocks 70.

Use of section 14 of apparatus 10 to remove standard field guides 19 from reticle 18 is identical to the use of section 12 with respect to guides 17 and reticle 16 as discussed previously. However, it is obvious that reticle 18 must be placed in the apparatus with the non-metallized surfaces facing upwardly in order that guides 19 may be placed in contact with heater blocks 70.

It will be recognized that the above described invention may be embodied in other specific forms without departing from the spirit or essential characteristics of the disclosure. Thus, it is understood that the invention is not to be limited by the foregoing illustrative details except as set forth in the appended claims.

We claim:

1. An apparatus for removing a stepper guide that is bonded to a reticle with an adhesive comprising:

a base;

support means coupled to said base for supporting the reticle in a generally horizontal position;

heater means for conductively heating the stepper guide having a generally planar upper surface and disposed on said base so that the stepper guide is in intimate contact with said planar upper surface when the reticle is supported by said support means; and controller means for maintaining the temperature of said heater means at a predetermined value;

whereby the stepper guide is heated to a temperature at which the adhesive flows and the stepper guide may be removed from the reticle.

2. The apparatus of claim 1 wherein said planar upper surface is shaped to receive a wide field stepper guide.

3. The apparatus of claim 1 wherein said planar upper surface is shaped to receive a narrow field stepper guide.

4. The apparatus of claim 1 wherein said heater means comprises two heater blocks disposed on said base so that when a reticle having two stepper guides is placed in said apparatus both of said two stepper guides are heated simultaneously.

5. The apparatus of claim 1 wherein said predetermined temperature value is within the range of approximately 650° F. to 750° F.

6. A method for removing a stepper guide that is bonded to a reticle with an adhesive comprising the steps of:

supporting the reticle in a generally horizontal position with the stepper guide in intimate contact with a heating plate such that the stepper guide is constrained from moving horizontally;

controlling the temperature of the heating plate to maintain a predetermined temperature value;

leaving the reticle in said horizontal position until the adhesive begins to flow; and applying manual pressure to rotate the reticle in a horizontal plane so that the stepper guide is detached from the reticle.

7. The method of claim 1 wherein said predetermined temperature value is within the range of approximately 650° F. to 750° F.

* * * * *